(12) United States Patent
Nakata

(10) Patent No.: US 8,450,796 B2
(45) Date of Patent: May 28, 2013

(54) POWER SEMICONDUCTOR DEVICE

(75) Inventor: Kazunari Nakata, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/148,326

(22) PCT Filed: Apr. 28, 2009

(86) PCT No.: PCT/JP2009/058320
§ 371 (c)(1),
(2), (4) Date: Aug. 8, 2011

(87) PCT Pub. No.: WO2010/125639
PCT Pub. Date: Nov. 4, 2010

(65) Prior Publication Data
US 2011/0309436 A1  Dec. 22, 2011

(51) Int. Cl.
*H01L 29/66* (2006.01)

(52) U.S. Cl.
USPC ............ 257/330; 257/739; 438/270; 438/597

(58) Field of Classification Search
None
See application file for complete search history.

(56) References Cited

U.S. PATENT DOCUMENTS

| | | | | |
|---|---|---|---|---|
| 5,578,522 A * | 11/1996 | Nakamura et al. | ............ | 438/138 |
| 5,665,996 A * | 9/1997 | Williams et al. | ............... | 257/401 |
| 5,894,149 A * | 4/1999 | Uenishi et al. | ................ | 257/331 |
| 6,118,150 A * | 9/2000 | Takahashi | ..................... | 257/341 |
| 6,661,054 B1 * | 12/2003 | Nakamura | ..................... | 257/330 |
| 6,806,548 B2 * | 10/2004 | Shirai et al. | .................... | 257/473 |
| 6,984,864 B2 * | 1/2006 | Uno et al. | ...................... | 257/382 |
| 7,049,668 B1 * | 5/2006 | Hshieh | ........................... | 257/401 |
| 7,176,521 B2 * | 2/2007 | Kawamura et al. | ........... | 257/330 |
| 7,358,143 B2 * | 4/2008 | Uno et al. | ..................... | 438/296 |
| 7,576,392 B2 * | 8/2009 | Kawano et al. | ................ | 257/341 |

(Continued)

FOREIGN PATENT DOCUMENTS

| | | |
|---|---|---|
| JP | 9 260663 | 10/1997 |
| JP | 2000 12845 | 1/2000 |

(Continued)

OTHER PUBLICATIONS

JP2007115923, May 10, 2007, Machine Translation.*

(Continued)

*Primary Examiner* — Evan Pert
*Assistant Examiner* — Andres Munoz
(74) *Attorney, Agent, or Firm* — Oblon, Spivak, McClelland, Maier & Neustadt, L.L.P.

(57) ABSTRACT

A gate electrode is provided for controlling a current flowing through a semiconductor layer. A gate insulating film electrically insulates the semiconductor layer and the gate electrode from each other. A conductor portion is provided on the semiconductor layer, and electrically connected with the semiconductor layer. An interlayer insulating film is provided on the gate electrode such that the conductor portion is electrically insulated from the gate electrode. A buffer insulating film covers a partial region on the conductor portion and the interlayer insulating film, and is made of an insulator. An electrode layer has a wiring portion located on a region from which the conductor portion is exposed, and a pad portion located on the buffer insulating film. Thereby, damage to an IGBT caused when a wire is connected to the pad portion can be suppressed. Further, larger electric power can be handled, while preventing occurrence of breakage due to current concentration.

8 Claims, 3 Drawing Sheets

U.S. PATENT DOCUMENTS

| | | | |
|---|---|---|---|
| 7,812,409 B2* | 10/2010 | Hshieh | 257/401 |
| 8,178,947 B2* | 5/2012 | Takahashi et al. | 257/565 |
| 8,207,612 B2* | 6/2012 | Torii et al. | 257/773 |
| 2003/0042537 A1* | 3/2003 | Nakamura et al. | 257/328 |
| 2003/0085422 A1* | 5/2003 | Amali et al. | 257/329 |
| 2004/0016979 A1* | 1/2004 | Kawano et al. | 257/401 |
| 2004/0262678 A1* | 12/2004 | Nakazawa et al. | 257/330 |
| 2005/0199953 A1* | 9/2005 | Kawamura et al. | 257/341 |
| 2005/0233499 A1 | 10/2005 | Okuda et al. | |
| 2006/0273382 A1* | 12/2006 | Hshieh | 257/330 |
| 2007/0034943 A1 | 2/2007 | Kushiyama et al. | |
| 2011/0298048 A1* | 12/2011 | Senoo et al. | 257/335 |

FOREIGN PATENT DOCUMENTS

| | | |
|---|---|---|
| JP | 2000 195866 | 7/2000 |
| JP | 2000 294802 | 10/2000 |
| JP | 2005 19828 | 1/2005 |
| JP | 2005 116788 | 4/2005 |
| JP | 2005 303218 | 10/2005 |
| JP | 2006 324265 | 11/2006 |
| JP | 2007 42817 | 2/2007 |
| JP | 2007 115923 | 5/2007 |
| JP | 2007 273931 | 10/2007 |
| JP | 2009 117755 | 5/2009 |

OTHER PUBLICATIONS

International Search Report Issued Jul. 14, 2009 in PCT/JP09/058320 filed Apr. 28, 2009.

* cited by examiner

POWER SEMICONDUCTOR DEVICE

TECHNICAL FIELD

The present invention relates to a power semiconductor device.

BACKGROUND ART

A power semiconductor device for handling relatively high electric power mainly from several hundred kilowatts to several megawatts may be used in an inverter circuit for an industrial motor, an automotive motor, and the like, a power supply for a large-capacity server, an uninterruptible power supply, and the like. Examples of the power semiconductor device include a semiconductor switch such as a MOSFET (Metal-Oxide-Semiconductor Field-Effect Transistor) and an IGBT (Insulated Gate Bipolar Transistor). As the IGBTs, while planar gate IGBTs have been widely used conventionally, vertical IGBTs using a trench gate making high integration possible have recently come to be used.

In order to further increase a current handled by such an IGBT using a trench gate, for example, according to Japanese Patent Laying-Open No. 2007-273931 (Patent Literature 1), a power semiconductor element (power semiconductor device) includes an emitter plug, and an emitter pad connected to the emitter plug.

Electrical connection to the pad as described above is performed, for example, by wire bonding. On this occasion, a transistor may be damaged by an impact received by a portion immediately below the pad. This is mainly due to miniaturization of the size (an interval, dimensions, a film thickness, and the like) of parts in accordance with high integration. To suppress such damage, for example, according to Japanese Patent Laying-Open No. 2006-324265, a semiconductor device is characterized in that a plurality of conductive layer wiring metals and interlayer insulating films are alternately stacked immediately below a pad, the conductive layer wiring metals adjacent with an interlayer insulating film sandwiched therebetween are connected through a via, the stacked layers are divided into a plurality of fine layers made of a different interlayer insulating film material, and a via formed in an interlayer insulating film formed above an interface between the interlayer insulating films made of different materials has a diameter greater than that of another via.

CITATION LIST

Patent Literature

PTL 1: Japanese Patent Laying-Open No. 2007-273931
PTL 2: Japanese Patent Laying-Open No. 2006-324265

SUMMARY OF INVENTION

Technical Problem

According to the technique of Japanese Patent Laying-Open No. 2007-273931, there is a problem that the power semiconductor device may be damaged at the time of the electrical connection to the pad, as described above.

In addition, according to the technique of Japanese Patent Laying-Open No. 2006-324265, electrical connection is performed through a plurality of vias having diameters different from each other. Accordingly, more number of patternings is required in the manufacturing step, and thus pattern defects and pattern variations are likely to occur. As a result, variations are likely to occur in energization ability of power semiconductor devices. In particular, the energization ability significantly varies due to variations in the cross sectional area of a via having a small diameter. Therefore, there is a problem that it is difficult to stably obtain a power semiconductor device handling large electric power.

The present invention has been made to solve problems as described above. One object of the present invention is to provide a power semiconductor device capable of handling large electric power and suppressing damage caused by electrical connection to a pad.

Solution to Problem

A power semiconductor device in accordance with the present invention has a semiconductor layer, a gate electrode, a gate insulating film, a conductor portion, an interlayer insulating film, a buffer insulating film, and an electrode layer. The gate electrode is provided for controlling a current flowing through the semiconductor layer. The gate insulating film electrically insulates the semiconductor layer and the gate electrode from each other. The conductor portion is provided on the semiconductor layer, and electrically connected with the semiconductor layer. The interlayer insulating film is provided on the gate electrode such that the conductor portion is electrically insulated from the gate electrode. The buffer insulating film covers a partial region on the conductor portion and the interlayer insulating film, and is made of an insulator. The electrode layer has a wiring portion located on a region from which the conductor portion is exposed, and a pad portion located on the buffer insulating film

Advantageous Effects of Invention

According to the power semiconductor device of the present invention, the pad portion is located on the buffer insulating film. Accordingly, an impact applied to the semiconductor layer when electrical connection to the pad portion is performed is mitigated by the buffer insulating film. Therefore, damage to the power semiconductor device can be suppressed. Further, a short current path linearly connecting between the semiconductor layer immediately below the pad portion and the pad portion is blocked by the buffer insulating film. Accordingly, current concentration immediately below the pad portion can be prevented. Therefore, breakage of the power semiconductor device due to the current concentration is prevented, and thus larger electric power can be handled.

DESCRIPTION OF EMBODIMENTS

Hereinafter, embodiments of the present invention will be described with reference to the drawings. It is to be noted that an emitter electrode (electrode layer) and a wire are not shown in the partial plan views (FIGS. 1 and 4), and that a conductor portion and an interlayer insulating film are hatched to make the drawings easy to view.

Embodiment 1

Figure 1:
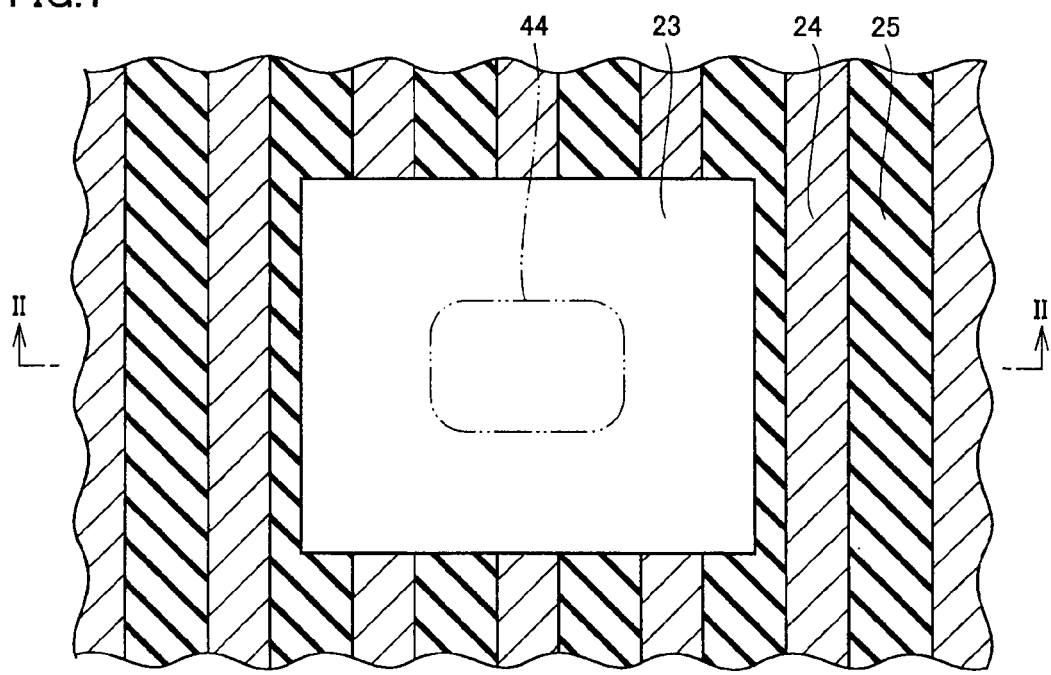
FIG. 1 is a partial plan view schematically showing a configuration of a power semiconductor device in Embodiment 1 of the present invention.
Figure 2:
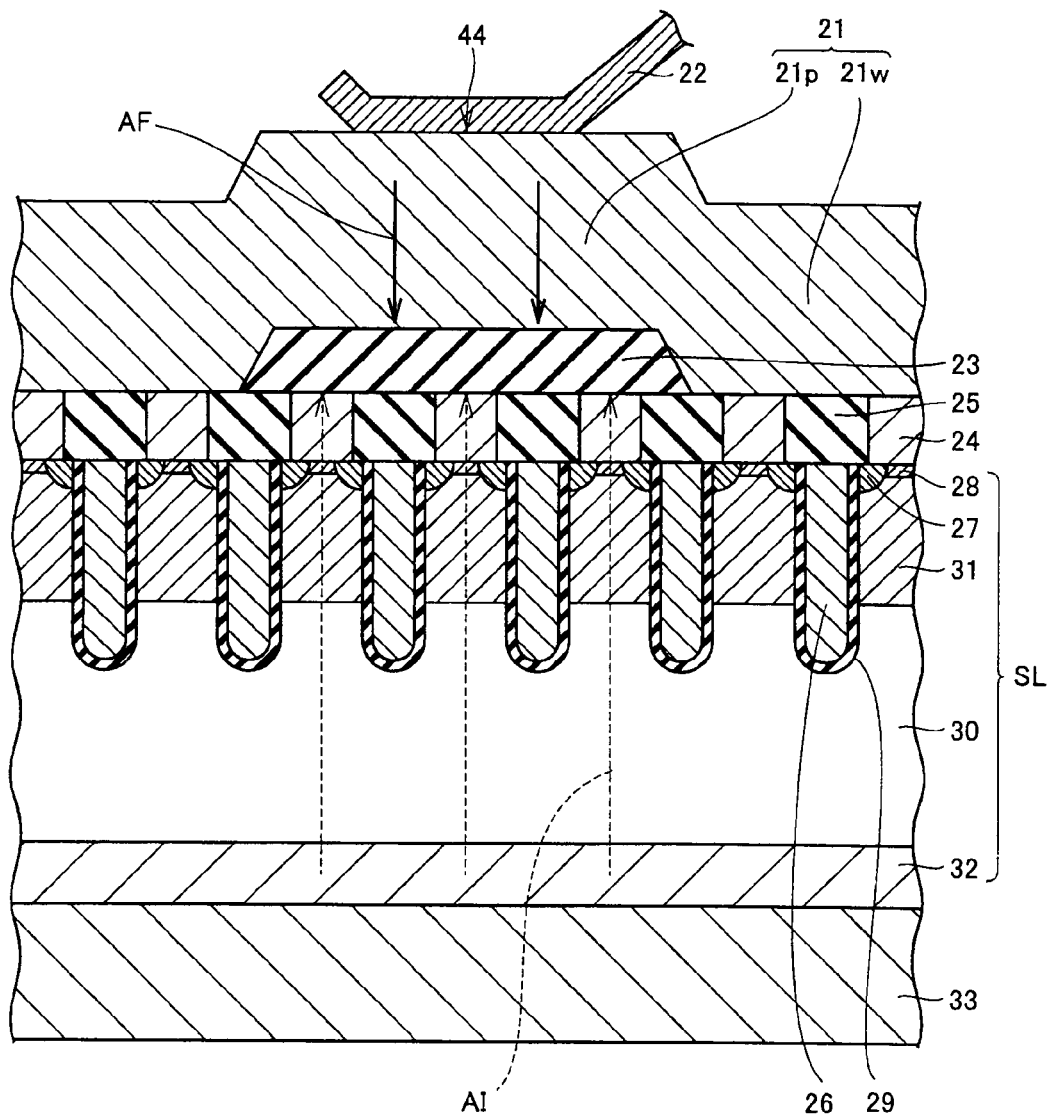
FIG. 2 is a schematic cross sectional view along a line II-II in FIG. 1.

Referring to FIGS. 1 and 2, an IGBT as a power semiconductor device in accordance with the present embodiment has a semiconductor layer SL, a gate electrode 26, a gate insulating film 29, a conductor portion 24, an interlayer insulating film 25, a buffer insulating film 23, an emitter electrode 21 (electrode layer), a collector electrode 33, and a wire 22.

As a semiconductor portion of the IGBT, semiconductor layer SL has an $n_E$ layer 27 which will serve as an emitter, a p$^+$ layer 28 for obtaining ohmic contact, an $n_B$ layer 30 called as a base or the like, and a $p_C$ layer 32 which will serve as a collector. $n_E$ layer 27 and $n_B$ layer 30 are n-type semiconductor layers, p$^+$ layer 28, $p_B$ layer 31, and $p_c$ layer 32 are p-type semiconductor layers, and the semiconductor layers are silicon layers. Further, semiconductor layer SL has a plurality of trenches extending along one direction (i.e., a vertical direction in FIG. 1) and arranged to be spaced from one another in a direction intersecting the one direction (i.e., a horizontal direction in FIGS. 1 and 2). Each trench faces $n_E$ layer 27, $p_B$ layer 31, and $n_B$ layer 30. That is, the trenches are formed in stripes in the semiconductor layer.

Gate electrode 26 is provided for controlling a current flowing through semiconductor layer SL in a thickness direction (i.e., a vertical direction in FIG. 2), as a gate electrode of the IGBT. That is, the power semiconductor device in accordance with the present embodiment is a vertical IGBT. Further, gate electrode 26 is formed by filling the trench formed in semiconductor layer SL with, for example, polycrystalline silicon, and is a so-called trench gate. Gate insulating film 29 is made of a thin silicon oxide film or the like, and electrically insulates semiconductor layer SL and gate electrode 26 from each other.

Conductor portion 24 is provided on semiconductor layer SL, and electrically connected with $n_E$ layer 27 and p$^+$ layer 28 of semiconductor layer SL. On the other hand, interlayer insulating film 25 is provided on gate electrode 26 such that conductor portion 24 is electrically insulated from gate electrode 26. Conductor portion 24 is formed of a material having an electrical conductivity higher than that of gate electrode 26, for example, a tungsten material. Interlayer insulating film 25 is formed of, for example, a silicon oxide film using TEOS (tetraethylorthosilicate) as an organic material (hereinafter referred to as a TEOS film). Conductor portion 24 is a so-called contact (plug) provided in interlayer insulating film 25, and electrically connects semiconductor layer SL and emitter electrode 21.

As shown in FIG. 1, buffer insulating film 23 covers a partial region on conductor portion 24 and interlayer insulating film 25. Thus, buffer insulating film 23 includes a portion located above gate electrode 26 with interlayer insulating film 25 interposed therebetween, as shown in FIG. 2. Preferably, in this case, each end portion (i.e., each of right and left ends in FIG. 1) of buffer insulating film 23 parallel to the direction in which the trenches extend in planar view is located not on conductor portion 24 but on interlayer insulating film 25. Further, buffer insulating film 23 is a film made of an insulator, and, for example, a TEOS film as with interlayer insulating film 25, an SOG (spin on glass) film, or an organic insulating film. As the organic insulating film, for example, a polyimide film can be used.

Emitter electrode 21 is formed of, for example, aluminum, and has a pad portion 21p located on buffer insulating film 23, and a wiring portion 21w located on conductor portion 24 and interlayer insulating film 25 to surround pad portion 21p in planar view.

Pad portion 21p is used as a bonding pad. That is, pad portion 21p is a portion to which wire 22 is bonded.

Wiring portion 21w is located on a portion which is not covered with buffer insulating film 23 and from which conductor portion 24 and interlayer insulating film 25 are exposed (i.e., a portion other than the partial region on conductor portion 24 and interlayer insulating film 25 described above). Thus, wiring portion 21w has direct electrical connection with conductor portion 24 immediately therebelow, and is electrically connected with pad portion 21p insulated from conductor portion 24 immediately therebelow.

Wire 22 is bonded to pad portion 21p of emitter electrode 21 at a bonded portion 44. Wire 22 is, for example, an aluminum wire to which an ultrasonic wire bonding method is applied.

Concerning preferable dimensions of buffer insulating film 23 corresponding to pad portion 21p, firstly, buffer insulating film 23 has a film thickness that is not less than one-fifth and not more than four-fifths of a thickness of pad portion 21p of emitter electrode 21.

As for the size of buffer insulating film 23, it has a width dimension (i.e., a dimension in the vertical direction in FIG. 1) that is not less than a width (diameter) dimension of wire 22 and not more than three times the width dimension of wire 22, and a length (i.e., a length in the horizontal direction in FIG. 1) that is not less than a length of bonded portion 44 bonded to wire 22 and not more than three times the length of bonded portion 44. Further, if a plurality of buffer insulating films 23 are provided corresponding to a plurality of wires 22, the sum of areas of buffer insulating films 23 (i.e., a total area) is not more than half an area of emitter electrode 21.

According to the present embodiment, as shown in FIG. 2, pad portion 21p as a bonding pad is located on buffer insulating film 23. Therefore, an impact AF applied to semiconductor layer SL during bonding is mitigated by buffer insulating film 23, and thus damage to the IGBT caused when wire 22 is connected to pad portion 21p can be suppressed.

Further, since buffer insulating film 23 includes a portion located above gate electrode 26 with interlayer insulating film 25 interposed therebetween, gate electrode 26 is protected from impact AF by buffer insulating film 23.

In addition, since damage due to connection of wire 22 is suppressed as described above, wire bonding of wire 22 can be performed under a stronger condition. Specifically, for example, wire bonding can be performed using a stronger ultrasonic wave or a stronger load. Thereby, a bonding strength and a bonding area at bonded portion 44 where wire 22 is bonded to pad portion 21p can be increased. Therefore, a limit life at which bonded portion 44 is finally delaminated due to temperature cycling, that is, a power cycle life, can be increased. Thus, larger electric power can be handled, while ensuring a sufficient life.

In particular, in the case where gate electrode 26 is a trench gate as in the present embodiment, if strong impact AF is applied to the vicinity of the trench, a crack is likely to occur between gate electrode 26 and $n_E$ layer 27. Occurrence of such a crack may cause a reduction in a withstand voltage or occurrence of a short circuit between gate electrode 26 and $n_E$ layer 27. According to the present embodiment, however, impact AF is mitigated by buffer insulating film 23, and thus occurrence of a crack as described above can be suppressed.

Further, according to the present embodiment, as shown in FIG. 2, a short current path AI linearly connecting between p+ layer 28 immediately below pad portion 21p and pad portion 21p is blocked by buffer insulating film 23. Therefore, current concentration immediately below pad portion 21p in which bonded portion 44 for wire 22 is located can be prevented, and thus breakage due to the current concentration is prevented. Consequently, larger electric power can be handled, while preventing occurrence of breakage due to current concentration.

In addition, conductor portion 24 has an electrical conductivity higher than that of gate electrode 26. Conductor portion 24 having a high electrical conductivity can reduce voltage drop that depends on a length of an electrical path to pad portion 21p in each of $n_E$ layer 27 and p+ layer 28. Thereby, the entire IGBT can be operated more evenly, and thus larger electric power can be handled.

Figure 3:
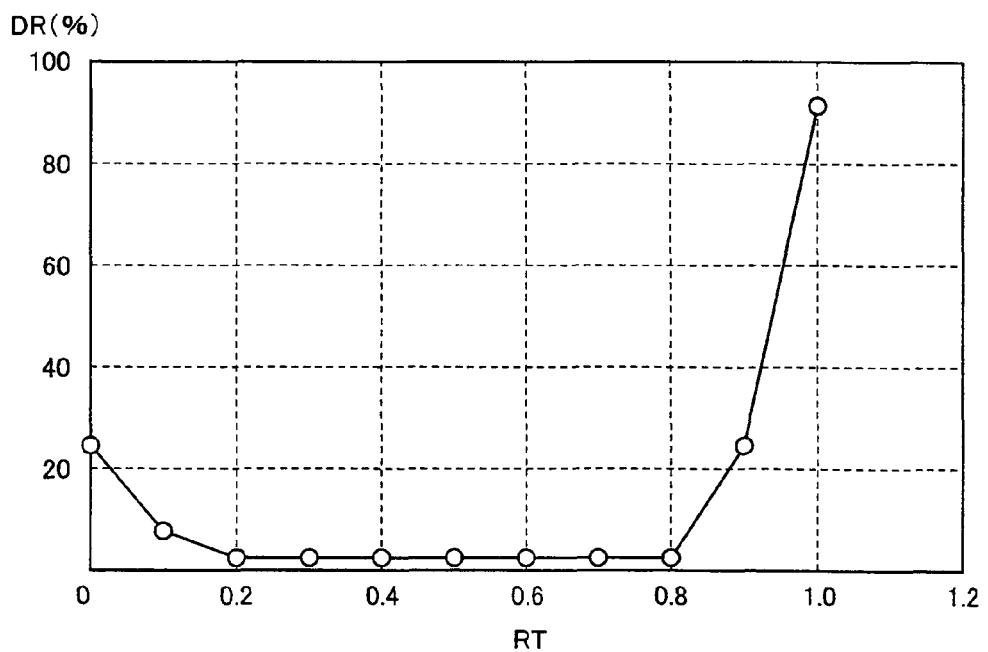
FIG. 3 is a graph showing an example of relationship between the rate of defectiveness caused by electrical connection to a pad portion of the power semiconductor device in Embodiment 1 of the present invention and the thickness of a buffer insulating film, under an accelerated condition.

Further, buffer insulating film 23 has a thickness that is not less than one-fifth and not more than four-fifths of the thickness of pad portion 21p of emitter electrode 21. If the thickness of buffer insulating film 23 satisfies such a condition, the rate of defectiveness of the power semiconductor device can be reduced. As a result of conducting a verification experiment therefor, the relationship between a rate of defectiveness DR at the time of connecting wire 22 to pad portion 21p and a film thickness ratio RT (axis of abscissas) of the thickness of buffer insulating film 23 to the thickness of pad portion 21p of emitter electrode 21 was confirmed as shown in FIG. 3. That is, in the case where the thickness of pad portion 21p of emitter electrode 21 was set to 1, rate of defectiveness DR was significantly reduced when film thickness ratio RT of buffer insulating film 23 was not less than 0.2 and not more than 0.8 (i.e., not less than one-fifth and not more than four-fifths).

It is considered that, when film thickness ratio RT of buffer insulating film 23 was less than 0.2, buffer insulating film 23 was easily damaged by impact AF (FIG. 2) during wire bonding, and thus damage such as a short circuit occurred between gate electrode 26 and $n_E$ layer 27, causing an increase in rate of defectiveness DR. It is also considered that, when film thickness ratio RT of buffer insulating film 23 was more than 0.8, a step difference at a boundary between pad portion 21p and wiring portion 21w in emitter electrode 21 was excessively increased, and thus a break occurred at the step difference portion, causing an increase in rate of defectiveness DR.

In addition, buffer insulating film 23 has an area that is not more than half the area of emitter electrode 21. Thereby, a portion in which emitter electrode 21 is obstructed by buffer insulating film 23 is limited, and thus a sufficient area is ensured as an effective area of emitter electrode 21. Therefore, an increase in ON voltage and a decrease in saturation current of the IGBT can be suppressed.

Further, buffer insulating film 23 is made of a TEOS film or an SOG film using an organic material, an organic insulating film (polyimide film), or the like. Thereby, buffer insulating film 23 can be formed at a lower temperature, when compared with the case where buffer insulating film 23 is made of an inorganic material (such as silane). Therefore, an impurity profile can be controlled with higher accuracy, without re-diffusion of impurities in semiconductor layer SL. In addition, since buffer insulating film 23 having a large thickness can be formed easily, impact AF (FIG. 2) can be mitigated.

It is to be noted that an organic insulating film has a particularly excellent performance to mitigate impact AF resulting from hardness properties and the like of a material therefor.

Further, buffer insulating film 23 has a width dimension (i.e., a dimension in the vertical direction in FIG. 1) that is not less than the width dimension of wire 22. This can suppress bonded portion 44 from extending out of pad portion 21p on buffer insulating film 23 in a width direction. In addition, buffer insulating film 23 has a width dimension that is not more than three times the width dimension of wire 22. This can prevent the width dimension of pad portion 21p (buffer insulating film 23) from being excessively increased beyond the necessity as a bonding pad.

Further, buffer insulating film 23 has a length (i.e., a length in the horizontal direction in FIG. 1) that is not more than three times the length of bonded portion 44 bonded to wire 22. This can prevent the length of pad portion 21p (buffer insulating film 23) from being excessively increased beyond the necessity as a bonding pad.

Embodiment 2

Figure 4:
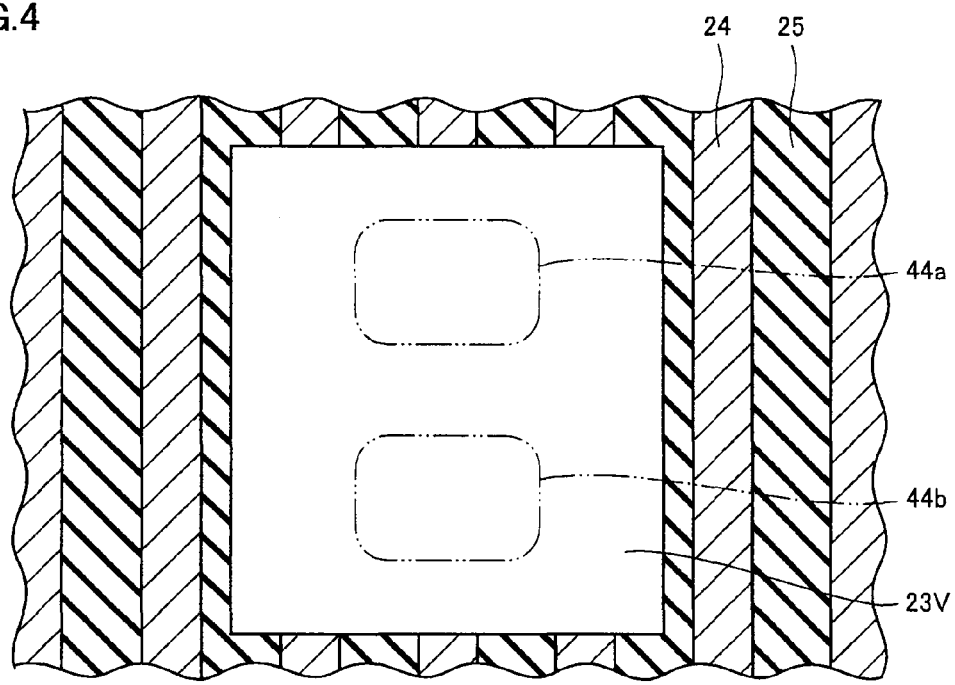
FIG. 4 is a partial plan view schematically showing a configuration of a power semiconductor device in Embodiment 2 of the present invention.

Referring to FIG. 4, a power semiconductor device in accordance with the present embodiment has a buffer insulating film 23V instead of buffer insulating film 23 (Embodiment 1: FIG. 1) Preferably, buffer insulating film 23V has an area that is not more than half the area of emitter electrode 21 (not shown in FIG. 4), as with buffer insulating film 23.

On buffer insulating film 23V, emitter electrode 21 covering buffer insulating film 23V is provided as in Embodiment 1. A portion of emitter electrode 21 on buffer insulating film 23V is a pad portion, and wire 22 (not shown in FIG. 4) is connected at each of a plurality of connection portions 44a, 44b.

Since the components other than that described above are substantially identical to those in Embodiment 1 described above, identical or corresponding elements will be designated by the same reference numerals, and the description thereof will not be repeated.

According to the present embodiment, a pad portion for a plurality of wires 22 is integrally formed. Therefore, the pad portion has an increased area when compared with the case where pad portions for wires 22 are separately formed. Thus, position accuracy of bonding of wire 22 can be ensured, and at the same time the area of the pad portion (buffer insulating film) can be reduced to an equal or smaller area, that is, a large area can be ensured as the effective area of the emitter electrode.

Further, if multiple wires are required, a distance between the buffer insulating films is shortened, and thus a void may be left between the buffer insulating films when emitter electrode 21 is formed. Also for such a problem, the integrally formed pad portion can prevent occurrence of a void and improve reliability.

In addition, since buffer insulating film 23V has an area that is not more than half the area of emitter electrode 21, and thereby a portion in which emitter electrode 21 is obstructed by buffer insulating film 23V is limited, a sufficient area is ensured as the effective area of emitter electrode 21. Therefore, an increase in ON voltage and a decrease in saturation current of the IGBT can be suppressed.

Although the IGBT has been described in the above embodiments, the power semiconductor device in accordance with the present invention is not limited thereto, and may be, for example, an MOSFET.

It should be understood that the embodiments disclosed herein are illustrative and non-restrictive in every respect. The scope of the present invention is defined by the scope of the claims, rather than the description above, and is intended to include any modifications within the scope and meaning equivalent to the scope of the claims.

INDUSTRIAL APPLICABILITY

The present invention is particularly advantageously applicable to a power semiconductor device.

REFERENCE SIGNS LIST

21: emitter electrode (electrode layer), 21$p$: pad portion, 21$w$: wiring portion, 22: wire, 23, 23V: buffer insulating film, 24: conductor portion, 25: interlayer insulating film, 26: gate electrode, 27: $n_E$ layer, 28: $p^+$ layer, 30: $n_B$ layer, 31: $p_B$ layer, 32: $p_C$ layer, 33: collector electrode, 44, 44$a$, 44$b$: bonded portion, SL: semiconductor layer.

The invention claimed is:

1. A power semiconductor device, comprising:
a semiconductor layer;
a gate electrode for controlling a current flowing through said semiconductor layer;
a gate insulating film electrically insulating said semiconductor layer and said gate electrode from each other;
a conductor portion provided on said semiconductor layer and electrically connected with said semiconductor layer;
an interlayer insulating film provided on said gate electrode such that said conductor portion is electrically insulated from said gate electrode;
a continuous buffer insulating film directly contacting a partial region of said conductor portion and a partial region of said interlayer insulating film and made of an insulator; and
an electrode layer having a wiring portion located on a region from which said conductor portion is exposed, and a pad portion located on said continuous buffer insulating film, wherein said gate electrode is a trench gate, and
wherein an end portion of said continuous buffer insulating film parallel to a direction in which said trench gate extends in a planar view is located on said interlayer insulating film.

2. The power semiconductor device according to claim 1, wherein said continuous buffer insulating film has a thickness that is not less than one-fifth and not more than four-fifths of a thickness of said pad portion of said electrode layer.

3. The power semiconductor device according to claim 1, wherein said continuous buffer insulating film has an area that is not more than half an area of said electrode layer.

4. The power semiconductor device according to claim 1, wherein said continuous buffer insulating film is any of a tetraethylorthosilicate (TEOS) film, a spin on glass (SOG) film, and an organic insulating film.

5. The power semiconductor device according to claim 1, further comprising a wire bonded to said pad portion of said electrode layer,
wherein said pad portion has a width dimension that is not less than a width dimension of said wire and not more than three times the width dimension of said wire.

6. The power semiconductor device according to claim 1, further comprising a wire bonded to said pad portion of said electrode layer,
wherein said pad portion has a length that is not more than three times a length of a portion of said pad portion bonded to said wire.

7. The power semiconductor device according to claim 1, wherein the end portion of the continuous buffer insulating film directly contacts the interlayer insulating film.

8. The power semiconductor device according to claim 1, wherein the pad portion of the electrode layer extends outward farther from the semiconductor layer in a thickness direction than the wiring portion of the electrode layer.

* * * * *